United States Patent
Boday et al.

(10) Patent No.: US 9,351,405 B2
(45) Date of Patent: May 24, 2016

(54) HYDROPHOBIC SILANE COATING FOR PREVENTING CONDUCTIVE ANODIC FILAMENT (CAF) GROWTH IN PRINTED CIRCUIT BOARDS

(71) Applicant: INTERNATIONAL BUSINESS MACHINES CORPORATION, Armonk, NY (US)

(72) Inventors: Dylan J. Boday, Tucson, AZ (US); Joseph Kuczynski, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/784,514

(22) Filed: Mar. 4, 2013

(65) Prior Publication Data

US 2013/0280417 A1    Oct. 24, 2013

Related U.S. Application Data

(62) Division of application No. 12/718,213, filed on Mar. 5, 2010.

(51) Int. Cl.
*H05K 3/00* (2006.01)
*D06M 11/79* (2006.01)
(Continued)

(52) U.S. Cl.
CPC ............... *H05K 3/00* (2013.01); *D06M 11/79* (2013.01); *D06M 13/513* (2013.01); *D06M 13/517* (2013.01)

(58) Field of Classification Search
None
See application file for complete search history.

(56) References Cited

U.S. PATENT DOCUMENTS

| | | | |
|---|---|---|---|
| 4,405,754 | A | 9/1983 | Moczygemba et al. |
| 4,877,757 | A | 10/1989 | York et al. |
| 5,360,875 | A | 11/1994 | Masse et al. |

(Continued)

FOREIGN PATENT DOCUMENTS

| | | |
|---|---|---|
| EP | 0837090 A1 | 4/1998 |
| JP | H04370275 A | 12/1992 |

(Continued)

OTHER PUBLICATIONS

Gerald L. Witucki, "A Silane Primer: Chemistry and Applications of Alkoxy Silanes", Journal of Coating Technology, vol. 65, No. 822, pp. 57-60, Jul. 1993, Copyright 1993, Federation of Societies for Coatings Technology.

(Continued)

*Primary Examiner* — Joseph Miller, Jr.
(74) *Attorney, Agent, or Firm* — Matthew J. Bussan (57) ABSTRACT

An enhanced substrate for making a printed circuit board (PCB) includes a hydrophobic silane coating of a silane composition intermixed with a silane coupling agent applied to a glass fiber substrate. The silane coupling agent is applied to the surface of the substrate for coupling the substrate to a varnish coating. Applying the silane coupling agent to the surface of the substrate creates surface silanols, which are implicated in conductive anodic filament (CAF) growth. A silane composition, which reacts with the surface silanols, is applied to the surface of the substrate having the silane coupling agent applied thereto to form the hydrophobic silane coating. The surface presented by the hydrophobic silane coating/substrate is hydrophobic and essentially silanol-free. This surface is then dried, and varnish is applied thereto. Then, the substrate, hydrophobic silane coating and varnish are subjected to curing conditions to define the PCB.

10 Claims, 3 Drawing Sheets

(51) Int. Cl.
*D06M 13/513* (2006.01)
*D06M 13/517* (2006.01)

(56) References Cited

U.S. PATENT DOCUMENTS

| | | | |
|---|---|---|---|
| 5,378,521 A * | 1/1995 | Ogawa et al. | 428/85 |
| 5,585,147 A | 12/1996 | Ogawa et al. | |
| 5,750,211 A | 5/1998 | Weise et al. | |
| 6,040,363 A | 3/2000 | Warner et al. | |
| 6,208,014 B1 | 3/2001 | Wu et al. | |
| 6,696,155 B1 | 2/2004 | Takano et al. | |
| 6,930,254 B2 | 8/2005 | Philips et al. | |
| 7,709,371 B2 | 5/2010 | Bhanap et al. | |
| 7,915,166 B1 * | 3/2011 | Yu et al. | 438/687 |
| 2002/0058140 A1 | 5/2002 | Dana et al. | |
| 2003/0129740 A1 | 7/2003 | Seo et al. | |
| 2004/0113523 A1 | 6/2004 | Hashimoto et al. | |
| 2007/0202253 A1 * | 8/2007 | Ong | 427/248.1 |
| 2008/0041105 A1 | 2/2008 | Hahn et al. | |
| 2008/0240479 A1 | 10/2008 | Linford et al. | |
| 2008/0241523 A1 | 10/2008 | Huignard et al. | |
| 2009/0087646 A1 | 4/2009 | Sirejacob | |
| 2009/0114428 A1 | 5/2009 | Ueno | |
| 2009/0142853 A1 | 6/2009 | Warrington et al. | |
| 2010/0212944 A1 | 8/2010 | Gelorme et al. | |
| 2010/0316868 A1 | 12/2010 | David et al. | |
| 2011/0214909 A1 | 9/2011 | Boday et al. | |
| 2013/0309809 A1 | 11/2013 | Eckhardt et al. | |

FOREIGN PATENT DOCUMENTS

| | | | |
|---|---|---|---|
| JP | 05239771 | A | 9/1993 |
| JP | H0693121 | A | 4/1994 |
| JP | 09012343 | A | 1/1997 |
| JP | H0912343 | A | 1/1997 |
| WO | 0249981 | A2 | 6/2002 |
| WO | 2008021161 | A2 | 2/2008 |
| WO | 2010097261 | A1 | 9/2010 |

OTHER PUBLICATIONS

"Silane Coupling Agents Guide, SiSiB(R) Silanes", Power Chemical Corporation Limited, pp. 1-7, Jun. 2009, Copyright 2009 Power Chemical Corporation Limited.
U.S. Appl. No. 12/694,005, to Gelorme et al., entitled "Silane Coupling Agents for Printed Circuit Boards", filed Jan. 26, 2010; which is a continuation-in-part of U.S. Appl. No. 12/391,500, to Gelorme et al., entitled "Silane Coupling Agents for Printed Circuit Boards", filed Feb. 24, 2009.
International Search Report and Written Opinion of the International Searching Authority for PCT filing of the patent application for IBM.
U.S. Appl. No. 12/718,213, to Boday et al., entitled "Hydrophobic Silane Coating for Preventing Conductive Anodic Filament (CAF) Growth in Printed Circuit Boards", filed Mar. 5, 2010.
English machine translation JP09012343 IPDL JPO (1997), 22 pages.
MONO definition Oxford dictionary, Oxford University Press (2014), 16 pages.
"monolayer", Oxford Dictionaries, Oxford University Press (2014), http://www.oxforddictionaries.com/us/definition/american_english/monolayer, accessed Aug. 17, 2014.
JP09012343English Translation by USPTOTranslator(1997), 58 pages.
English machine translation of JP05239771A (1993), 6 pages.

* cited by examiner

HYDROPHOBIC SILANE COATING FOR PREVENTING CONDUCTIVE ANODIC FILAMENT (CAF) GROWTH IN PRINTED CIRCUIT BOARDS

CROSS-REFERENCE TO RELATED APPLICATION

This patent application is a divisional application of pending U.S. patent application Ser. No. 12/718,213, filed Mar. 5, 2010, entitled "HYDROPHOBIC SILANE COATING FOR PREVENTING CONDUCTIVE ANODIC FILAMENT (CAF) GROWTH IN PRINTED CIRCUIT BOARDS", which is hereby incorporated herein by reference in its entirety.

BACKGROUND OF THE INVENTION

1. Field of Invention

The present invention relates in general to coated glass fiber substrates for use in making printed circuit boards (PCBs). More particularly, the present invention relates to preventing conductive anodic filament (CAF) growth in PCBs through an enhanced substrate that includes a hydrophobic silane coating of a silane composition intermixed with a silane coupling agent applied to a glass fiber substrate.

2. Background Art

The basic concept behind a coupling agent is to join two disparate surfaces. In the case of printed circuit boards (PCBs), a silane coupling agent is often used to join a varnish coating (e.g., an epoxy-based resin) to a substrate (e.g., glass cloth) to define a laminate, or laminated structure. The silane coupling agent typically consists of an organofunctional group to bind to the varnish coating and a hydrolyzable group that binds to the surface of the substrate. In particular, the alkoxy groups on the silicon hydrolyze to silanols, either through the addition of water or from residual water on the surface of the substrate. Subsequently, the silanols react with hydroxyl groups on the surface of the substrate to form a siloxane bond (Si—O—Si) and eliminate water.

For the specific case of epoxy-based laminates, the organofunctional group that has been found to exhibit desirable performance based on numerous criteria is vinylbenzylaminoethylaminopropyl and also benzylaminoethylaminopropyl. Silane coupling agents, which include this organofunctional group, are thought to covalently bond to the epoxide functional groups of the traditional epoxy-based resin, such as the well known FR4 epoxy resins, through the secondary nitrogens of the amino groups. While a plethora of silane coupling agents exists, the industry workhorse for coupling epoxy-based resins has been vinylbenzylaminoethylaminopropyl-trimethoxysilane (commercially available as Dow Corning Z-6032).

The PCB industry has recently migrated away from the traditional FR4 epoxy based resins (due to lead-free requirements and the higher soldering temperatures associated with tin-silver-copper alloys). Hence, current varnish coatings are typically no longer comprised of FR4 epoxies, rather they are more likely to be bismaleimide triazine (BT) resins or polyphenylene oxide/triallyl-isocyanurate (PPO/TAIC) interpenetrating networks. Typically, vinylbenzylaminoethylaminopropyltrimethoxysilane, originally developed for traditional FR4 epoxies, is still the coupling agent utilized to couple, or bond, the glass cloth substrate to the laminate varnish. However, other silane coupling agents have been proposed for use in making high-temperature PCBs. For example, U.S. patent application Ser. No. 12/694,005, to Gelorme et al., entitled "SILANE COUPLING AGENTS FOR PRINTED CIRCUIT BOARDS", filed Jan. 26, 2010, which is a continuation-in-part of U.S. patent application Ser. No. 12/391,500, to Gelorme et al., entitled "SILANE COUPLING AGENTS FOR PRINTED CIRCUIT BOARDS", filed Feb. 24, 2009, discloses such silane coupling agents, including diallylpropylisocyanuratetrimethoxysilane.

One problem experienced with PCBs is conductive anodic filament (CAF), which results from copper dissolution that emanates from the anode of a circuit and "grows" subsurface toward the cathode, frequently along separated glass fiber/varnish coating interfaces. With PCBs, anode/cathode pairs are typically plated through holes. CAF formation causes a number of reliability issues and can result in catastrophic failure of PCBs, which in some instances can cause fires. The bond between the varnish and substrate is understood to be an important factor in CAF, as is the presence of water in the varnish/substrate interface.

Generally, in locations on PCBs where there are sources of copper, an electrical bias, glass fiber, and moisture, potential exists for the formation of CAF. Typically, CAF occurs at the interface where the glass fiber has delaminated from the varnish, which creates a path for water diffusion. The reason this path is commonly associated with CAF formation is due to the exposure of surface silanols on the glass fibers. Silanols always exist on the surface of the glass fiber and, thus, there is always a pathway for the formation of CAF. Delamination does not have to occur to create this pathway. Additionally, CAF can occur from pre-existing water adsorbed onto the surface of the glass fiber (i.e., water may be deposited during processing of the glass fibers).

Surface silanols, as mentioned above, always exist on the surface of the glass fiber. These surface silanols are reacted when silane coupling agents, such as vinylbenzylaminoethylaminopropyltrimethoxysilane or diallylpropylisocyanuratetrimethoxysilane, are utilized to couple, or bond, the glass cloth substrate to the laminate varnish. As noted above, the alkoxy groups on the silicon of the silane coupling agent hydrolyze to silanols, either through the addition of water or from residual water on the surface of the substrate. Subsequently, the silanols react with hydroxyl groups on the surface of the substrate to form a siloxane bond (Si—O—Si) and eliminate water. Unfortunately, residual alkoxy groups on the silane coupling agent hydrolyze and create more silanols. Thus, more surface silanols are created by the silane coupling agent.

For example, when diallylpropylisocyanuratetrimethoxysilane is used as the silane coupling agent, even though the propyl group to which the trialkoxysilane is attached is hydrophobic (retarding ingress of water to the resin/glass interface and improving CAF resistance), surface silanols are nonetheless created. These surface silanols still provide a hydrophilic path for water diffusion, which leads to CAF formation.

Prior solutions to prevent CAF have typically used the addition of surface modifiers such as n-octyltrimethoxysilane and 3-methacryloxypropyltrimethysilane, but the addition of these silanes requires $CO_2$ reactors which operate at high pressures that are typically unsafe for large scale production. Additionally, the silanes used in this process create silanols, which still provide a hydrophilic path for water diffusion that ultimately leads to CAF formation. Although this process does reduce the likelihood of CAF formation, CAF inevitably occurs nonetheless due to the silanes used as surface modifiers.

Other prior solutions to prevent CAF using coated fiber strands are set forth in U.S. Patent Application Publication No. 2002/0058140 A1, to Dana et al., entitled "GLASS FIBER COATING FOR INHIBITING CONDUCTIVE ANODIC FILAMENT FORMATION IN ELECTRONIC SUPPORTS", published May 16, 2002. For example, the abstract of the above-referenced published patent application describes the use of a resin compatible coating composition on the surface of glass fibers, the resin compatible coating composition comprising (a) a plurality of discrete particles comprising a silicate having a high affinity for metal ions; and (b) at least one film-forming material. As disclosed in the above-referenced published patent application, particles containing copper getters are imbedded in a polymeric coating. Hence, this solution attempts to prevent the migration of copper through the polymeric coating containing the particles. However, this solution does nothing to address the moisture at the glass fiber/resin interface. By not treating this aspect, a path for CAF still exists. Additionally, the particles imbedded into the polymer coating will never come into intimate contact with the glass fiber and, thus, these particles will not effectively minimize copper migration. Also, there would be a finite amount of copper which could be gettered before the copper getters would become saturated with copper and no longer act as copper getters. Reaching this saturation point would create yet another path for CAF formation.

In another solution disclosed in the above-referenced published patent application, the particles in the resin compatible coating composition can also be formed from hydrophobic polymeric materials to reduce or limit moisture absorption by the coated strand. These particles are contained within a secondary layer which is applied over a primary layer of a primary sizing composition (silane coupling agent). Even though the particles in the secondary layer can be formed from hydrophobic polymeric material, surface silanols are nonetheless created by the underlying primary layer. These surface silanols still provide a hydrophilic path for water diffusion, which leads to CAF formation.

Moreover, the solutions disclosed in the above-referenced published patent application would be plagued with several other problems such as being thick (several microns), exhibiting a different thermal expansion than glass fiber, creating another interface for delamination to occur, severely changing glass cloth manufacturing, as well as being costly and complicated in that a number of materials are required just to prepare the resin compatible coating.

Therefore, a need exists for an enhanced mechanism for preventing conductive anodic filament (CAF) growth in printed circuit boards (PCBs).

SUMMARY OF THE INVENTION

According to the preferred embodiments of the present invention, an enhanced substrate for making a printed circuit board (PCB) includes a hydrophobic silane coating of a silane composition intermixed with a silane coupling agent applied to a glass fiber substrate. The silane coupling agent is applied to the surface of the substrate for coupling the substrate to a varnish coating. Applying the silane coupling agent to the surface of the substrate creates surface silanols, which are implicated in conductive anodic filament (CAF) growth. A silane composition, which reacts with the surface silanols, is applied to the surface of the substrate having the silane coupling agent applied thereto to form the hydrophobic silane coating. The surface presented by the hydrophobic silane coating/substrate is hydrophobic and essentially silanol-free. This surface is then dried, and varnish is applied thereto. Then, the substrate, hydrophobic silane coating and varnish are subjected to curing conditions to define the PCB.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

1. Overview

In accordance with the preferred embodiments of the present invention, an enhanced substrate for making a printed circuit board (PCB) includes a hydrophobic silane coating of a silane composition intermixed with a silane coupling agent applied to a glass fiber substrate. The silane coupling agent is applied to the surface of the substrate for coupling the substrate to a varnish coating. Applying the silane coupling agent to the surface of the substrate creates surface silanols, which are implicated in conductive anodic filament (CAF) growth. A silane composition, which reacts with the surface silanols, is applied to the surface of the substrate having the silane coupling agent applied thereto to form the hydrophobic silane coating. The surface presented by the hydrophobic silane coating/substrate is hydrophobic and essentially silanol-free. This surface is then dried, and varnish is applied thereto. Then, the substrate, hydrophobic silane coating and varnish are subjected to curing conditions to define the PCB.

2. Detailed Description

In accordance with the preferred embodiments of the present invention, a silane composition is applied to the surface of a glass fiber substrate (to which a silane coupling agent was earlier applied) to form a hydrophobic silane coating, which is an intermixed layer containing both silanes. That is, the silane composition in accordance with the preferred embodiments of the present invention is applied post silane coupling agent addition.

Figure 1:
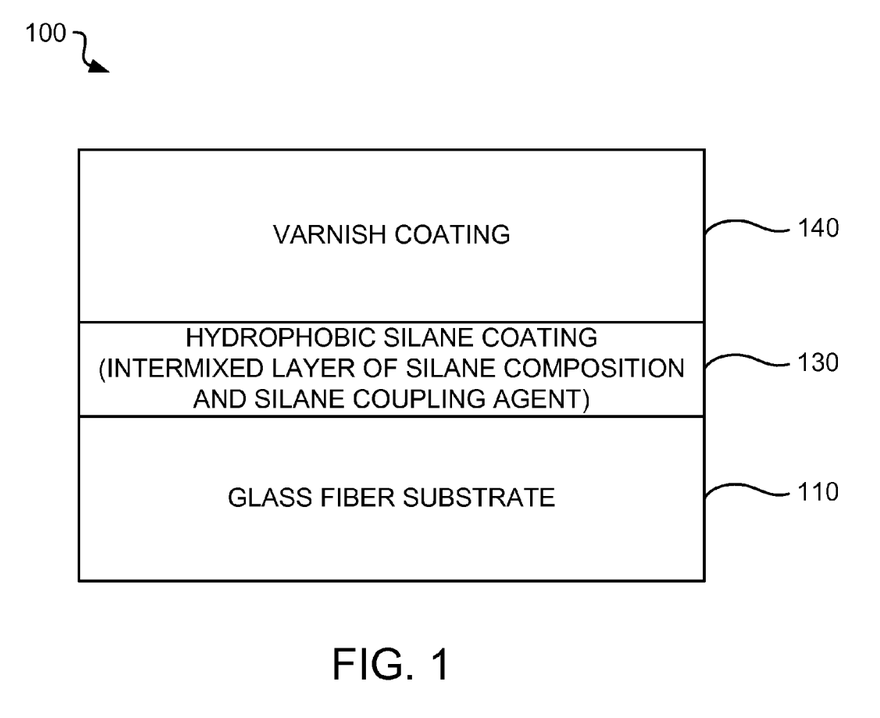
FIG. 1 is a block diagram illustrating a portion of a printed circuit board (PCB) in which a hydrophobic silane coating to prevent conducive anode filament (CAF) formation in accordance with the preferred embodiments of the present invention is provided between a varnish coating and a glass fiber substrate having its surface modified by a silane coupling agent.

FIG. 1 is a block diagram illustrating a portion of a printed circuit board (PCB) 100 in which a hydrophobic silane coating 130 to prevent conducive anode filament (CAF) formation in accordance with the preferred embodiments of the present invention is provided between a varnish coating 140 and a glass fiber substrate 110 having its surface modified by a silane coupling agent. The hydrophobic silane coating 130 is an intermixed layer containing both the silane composition and the silane coupling agent.

The substrate 110 is conventional and may be any suitable substrate that includes glass fiber. For example, the substrate 110 may be woven glass cloth.

The varnish coating 140 is conventional and may be any suitable organic or inorganic surface coating. For example, the varnish coating 140 may be an FR4 epoxy resin, a bismaleimide triazine (BT) resin, or a polyphenylene oxide/triallyisocyanurate (PPO/TAIC) interpenetrating network.

The silane coupling agent is conventional and may be any suitable silane coupling agent. The silane coupling agent typically consists of an organofunctional group to bind to the varnish coating 140 and a hydrolyzable group that binds to the surface of the substrate 110. For example, the silane coupling agent may be vinylbenzylaminoethylaminopropyltrimethoxysilane or diallylpropylisocyanurate-trimethoxysilane. Typically, the silane coupling agent is a mono-layer thick.

In accordance with the preferred embodiment of the present invention, the hydrophobic silane coating 130, which is an intermixed layer containing both silanes, is hydrophobic (water repelling). Consequently, a water droplet resting on the hydrophobic silane coating 130 will exhibit a high contact angle (i.e., at least 90°). The hydrophobic silane coating 130 is preferably a mono-layer thick.

The silane composition used to form the hydrophobic silane coating 130 in accordance with the preferred embodiments of the present invention includes a silane having a general formula structure $R_1$—Si—$R_{(2-4)}$, wherein $R_1$ is a functional group that is reactive with alcohols, water and/or surface silanols, and wherein $R_2$, $R_3$ and $R_4$ are each a functional group that is hydrophobic and non-reactive (i.e., $R_2$, $R_3$ and $R_4$ are each non-reactive with the alcohols, water and/or surface silanols with which $R_1$ is reactive). Examples of suitable silanes for the silane composition in accordance with the preferred embodiments of the present invention include (without limitation) chlorotrimethylsilane (i.e., $(CH_3)_3SiCl$, also known as trimethylsilylchloride or TMSCl), hexamethyldisilazane (i.e., $[(CH_3)_3Si]_2NH$, also known as HMDS or HMDZ), perfluorooctyl-1H,1H,2H,2H-dimethylchlorosilane (i.e., $C_{10}H_{10}ClF_{13}Si$), and (3,3,3-trifluoropropyl)dimethyl-chlorosilane (i.e., $C_5H_{10}ClF_3Si$); and combinations thereof.

Silane(s) used to produce the hydrophobic silane coating in accordance with the preferred embodiments of the present invention react with adsorbed water on the surface of the substrate, thus dehydrating all adsorbed water accumulated during fiber processing. Once the glass surface is dehydrated, these silanes then react with surface silanols creating a hydrophobic surface. The hydrophobic surface will prevent water diffusion into the interface between the varnish coating (which is subsequently applied in the process of making a printed circuit board) and the glass fiber in the printed circuit board. Even if delamination between the varnish coating and the glass fiber occurs in the printed circuit board, the normally hydrophilic glass fiber is hydrophobic, thus eliminating the most commonly associated path for CAF formation.

In accordance with the preferred embodiments of the present invention, silane(s) to prevent CAF formation (i.e., the silane(s) in the silane composition) can be added after the silane coupling agent has been applied. The addition of these silanes to prevent CAF formation, in one embodiment (shown in FIG. 2, described below), can be achieved by vapor deposition on the surface of the glass fibers, which may advantageously remove the need for the use of solvents.

Alternatively, in another embodiment (shown in FIG. 3, described below), the glass fibers can be surface modified with the silane(s) to prevent CAF formation using simple wet chemistry methods in a suitable hydrocarbon solvent or other suitable anhydrous solvent (typically, without the need for any additional catalyst). This allows the process to be tailored to a plethora of existing glass fiber modification processes. Examples of suitable hydrocarbon solvents include (without limitation) heptanes, hexanes, pentanes, xylenes, cyclohexane and toluene; and combinations thereof.

Once the glass fibers have been treated with the silane(s) to prevent CAF formation, there will be no build up of adsorbed water during fiber processing. Even if delamination occurs as a result of thermal expansion of the varnish coating (which is subsequently applied in the process of making a printed circuit board), the glass fiber will remain hydrophobic—thereby preventing a path for CAF formation. Addition of the silane(s) to prevent CAF formation does not leave any residual silanols (such residual silanols are associated with prior approaches).

Figure 2:
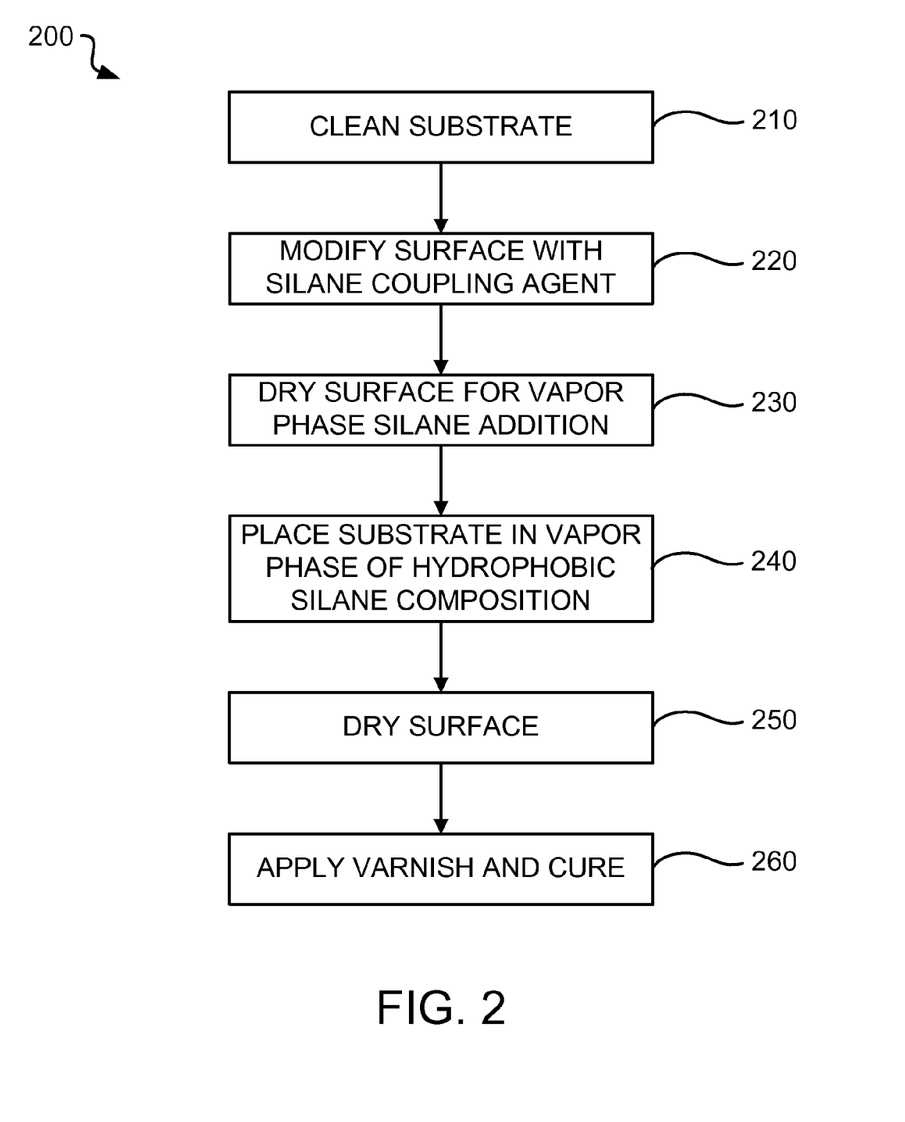
FIG. 2 is a flow diagram illustrating a method for applying, via vapor phase deposition, a silane composition to form a hydrophobic silane coating that prevents conducive anode filament (CAF) formation in a printed circuit board (PCB) made in accordance with the preferred embodiments of the present invention.

FIG. 2 is a flow diagram illustrating a method 200 for applying, via vapor phase deposition, a silane composition to form a hydrophobic silane coating that prevents conducive anode filament (CAF) formation in a printed circuit board (PCB) made in accordance with the preferred embodiments of the present invention. In the method 200, the steps discussed below (steps 210-260) are performed. These steps are set forth in their preferred order. It must be understood, however, that the various steps may occur at different times relative to one another than shown, or may occur simultaneously. Moreover, those skilled in the art will appreciate that one or more of the steps may be omitted.

Method 200 begins when a substrate that includes glass fiber is cleaned (step 210). The substrate is conventional and may be any suitable substrate that includes glass fiber. For example, the substrate may be woven glass cloth. The substrate is cleaned utilizing any suitable conventional cleaning process, such as the industry standard process for cleaning woven glass fabric described below.

Glass fiber is typically received at the glass weaver on a bobbin and contains a sizing agent typically present at approximately 1.5 wt % of the glass filament. The sizing agent is a starch and oil-based formulation that serves as an anti-static and slip agent which imparts strength to the fabric during the weaving process. The glass filament to be woven in the machine direction may contain 1 wt % PVA to impart additional mechanical strength during the warping process. Following weaving, the fabric is cleaned via an industry standard process:

1) The fabric is wound on a mandrel and subjected to temperatures in excess of 500 C for several hours (a process known to those skilled in the art as "carmelizing" as the fabric takes on a golden brown color).

2) Mandrels are subsequently subjected to temperatures greater than 200 C for several days (in order to permit the temperature in the center of the core to equilibrate with the temperature of the fabric surface).

3) The fabric is permitted to cool to ambient temperature overnight.

The method 200 continues with modification of the surface of the substrate with a silane coupling agent (step 220). The silane coupling agent is conventional and may be any suitable silane coupling agent. For example, the silane coupling agent may be vinylbenzylaminoethylaminopropyltrimethoxysilane or diallylpropylisocyanurate-trimethoxysilane. The silane coupling agent is applied to the surface of the substrate using any suitable conventional surface modification process.

Steps 210 and 220 may be omitted in favor of obtaining a conventional glass fiber substrate having its surface already modified with a silane coupling agent. Such surface modified glass fiber substrates are commercially available from glass weavers. The surface modification processes utilized by these glass weavers may include elements that are considered proprietary to the glass weaver.

Typical process parameters of conventional surface modification processes include the addition of a surfactant to a silane bath (i.e., typically, the glass fabric is dipped in a silane bath) to enhance wetting of the glass fabric as well as prevent foaming. The silane coupling agent concentration in the silane bath may be as high as 1 wt %, for example, though it is typically much less. The silane bath is typically acidic (pH 3-5) to prevent self-condensation of the silane.

In one exemplary conventional surface modification process, the glass fabric may be dipped into 0.1%-0.5% silane coupling agent/water solution (or water-ethanol solution), and then air-dried. The glass fabric may then be placed in a desiccator at 110-120 C for 5-10 minutes to cure the silane coupling agent on the surface of the substrate.

In another conventional surface modification process, an alcohol solution is used for silylating the surface of the substrate with a silane coupling agent. A 2% silane solution can be prepared in a suitable alcohol (e.g., methanol, ethanol, isopropanol, and the like). The surface of the substrate can be wiped, dipped, or sprayed with this solution. If the substrate is dipped into the solution, a sufficient submersion time (e.g., one or two minutes) may be necessary to allow silane migration to the surface of the substrate. The substrate is then dried (e.g., air-dried). After the surface of the substrate dries, excess material can be gently wiped, or briefly rinsed off with alcohol. The layer of silane coupling agent may then be cured on the surface of the substrate for 5-10 minutes at 110 C, or for 24 hours at ambient temperature.

The method 200 may continue with the drying of the surface of the substrate (i.e., the treated glass fabric) in preparation for vapor phase addition of a silane composition (step 230). For example, the treated glass fabric may be dried at 110-120 C for 5-10 minutes. However, step 230 may be at least partially performed as part of step 220, discussed above, when the silane coupling agent is cured on the surface of the substrate.

Once the glass fiber has been treated with a silane coupling agent, a large portion of the surface silanols remain. This leaves the surface hydrophilic (water loving) and more likely to increase the chance of CAF formation.

The prior art recognized that a moderate cure cycle (110 C/15 minutes) will leave silanol groups remaining in free form. See, for example, Gerald L. Witucki, "A Silane Primer: Chemistry and Applications of Alkoxy Silanes", Journal of Coating Technology, Vol. 65, No. 822, pages 57-60, July 1993. However, the prior art mistakenly classified these surface silanols as advantageous (rather than as a potentially ruinous path for CAF formation) because the silanols may bond with the subsequent top coat, forming an interpenetrating polymer network (IPN) and providing an improved adhesion.

By treating the surface with a silane composition in accordance with the present invention, the remaining surface silanols will be reacted with and removed. Also, by treating the surface silanols with a silane composition in accordance with the present invention, the surface will become extremely hydrophobic (water repelling). Not only will the use of a silane composition in accordance with the present invention remove surface silanols, but it will also react with and remove any adsorbed water on the surface of the glass fibers preventing another path for CAF formation.

The method 200 then continues by placing the substrate (i.e., the treated and dried glass fabric) in a vapor phase of a silane composition in accordance with the present invention (step 240). To modify the surface of a glass fiber with a silane composition in accordance with the present invention using vapor phase deposition techniques, the substrate must be passed through or placed within a chamber that allows for the silane composition to build up a vapor pressure. Such vapor deposition techniques are well known by those skilled in the art.

The silane composition in accordance with the present invention includes a silane having a general formula structure $R_1$—Si—$R_{(2-4)}$, wherein $R_1$ is a functional group that is reactive with alcohols, water and/or surface silanols, and wherein $R_2$, $R_3$ and $R_4$ are each a functional group that is hydrophobic and non-reactive (i.e., $R_2$, $R_3$ and $R_4$ are each non-reactive with the alcohols, water and/or surface silanols with which $R_1$ is reactive). Examples of suitable silanes for the silane composition in accordance with the preferred embodiments of the present invention include (without limitation) chlorotrimethylsilane (i.e., $(CH_3)_3SiCl$, also known as trimethylsilylchloride or TMSCl), hexamethyldisilazane (i.e., $[(CH_3)_3)Si]_2NH$, also known as HMDS or HMDZ), perfluorooctyl-1H,1H,2H,2H-dimethylchlorosilane (i.e., $C_{10}H_{10}ClF_{13}Si$), and (3,3,3-trifluoropropyl)dimethyl-chlorosilane (i.e., $C_5H_{10}ClF_3Si$); and combinations thereof.

The vapor pressure can range from 0.1 to 1000 mm Hg, preferably 0.5 to 500 mm Hg and most preferably 2 to 7 mm Hg of vapor pressure. The following example is for purposes of illustration and is non-limiting. In this (non-limiting) example, silane vapor is generated by placing the silane or a silane/hydrocarbon solvent solution (utilizes the partial pressure contribution of the hydrocarbon solvent mixed with the silane) in a reservoir below the surface to be coated. The reservoir is heated to generate the vapor pressure. If the silane has a low vapor pressure, vacuum can be applied to the chamber to increase the vapor concentration of the silane. The substrate, as it is coated, is typically maintained at an elevated temperature ranging from 25 C to 150 C, preferably 35 C to 125 C and most preferably 45 C to 90 C. The duration the substrate is exposed to the vapor phase of the silane composition can range, for example, from 0.1 to 1440 minutes, preferably 0.5 to 180 minutes and most preferably 2 to 30 minutes, depending on the final silane surface coverage desired. The hydrophobic silane coating is preferably a mono-layer thick. Those skilled in the art will appreciate, however, that the final silane surface coverage desired will vary depending on the particular application. Also, it may be desirable to apply catalyst (e.g., amines) to the vapor phase of the silane composition to increase the rate of reaction, which in turn may permit a reduction in the duration of exposure of the substrate to the vapor phase.

Once removed from the chamber, the coated substrate (i.e., hydrophobic silane coating/substrate) is dried using any suitable conventional methodology known to those skilled in the art (step 250). For example, the coated substrate may be dried at 110-120 C for 5-10 minutes. Because the surface of the coated substrate is hydrophobic, any residual water thereon is easily and completely removed during step 250.

The coated substrate (i.e., hydrophobic silane coating/substrate) may then be further processed using conventional PCB fabrication techniques (step 260). For example, a conventional varnish (e.g., FR4 epoxy resins, bismaleimide triazine (BT) resins, polyphenylene oxide/trially-isocyanurate (PPO/TAIC) interpenetrating networks, and the like) may be applied to the coated substrate using any suitable conventional methodology known to those skilled in the art. After which the laminate is subjected to curing conditions, e.g., heated under vacuum, as known in the art, which results in a crosslinked phase that is covalently bound to the glass fibers to define a laminate, or laminated PCB. The hydrophobic surface of the coated substrate will prevent water diffusion into the interface between the varnish coating and the glass fiber in the laminated PCB. Even if delamination between the varnish coating and the glass fiber occurs in the PCB, the normally hydrophilic glass fiber is hydrophobic, thus eliminating the most commonly associated path for CAF formation.

Figure 3:
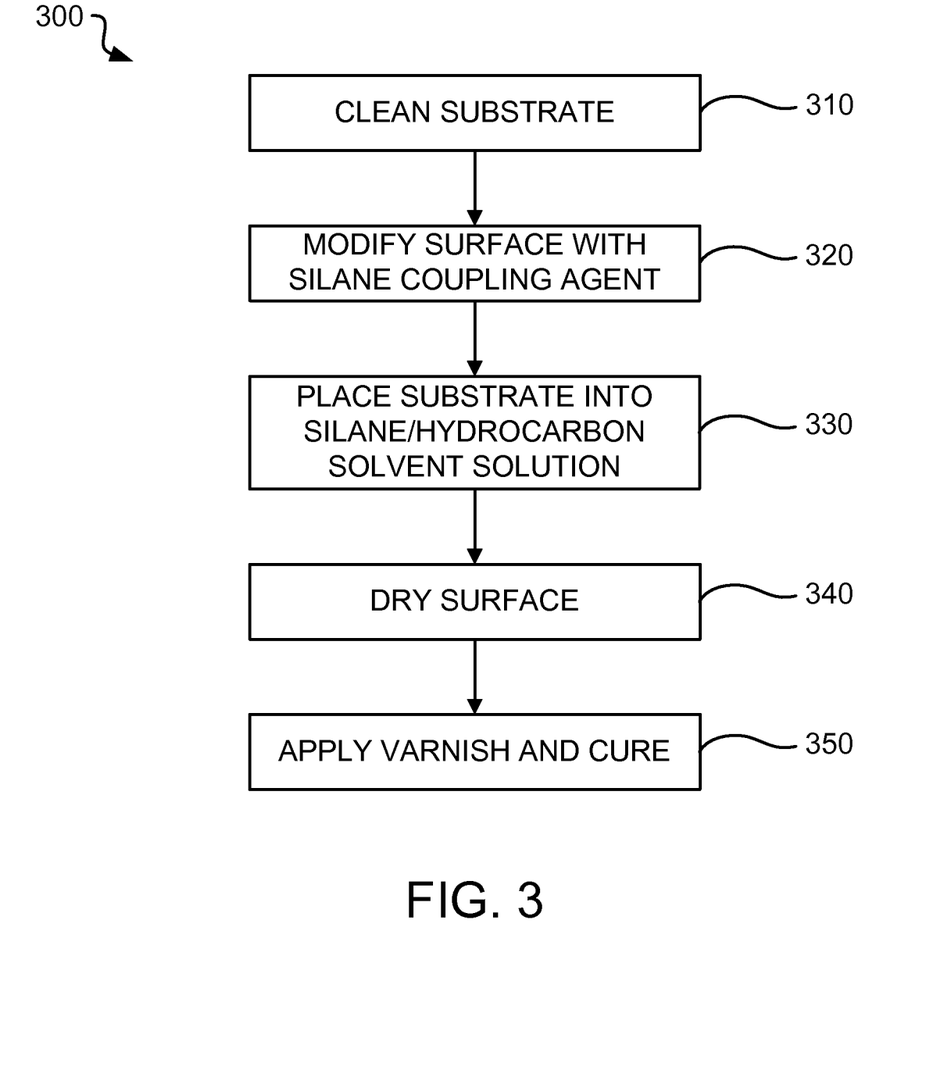
FIG. 3 is a flow diagram illustrating a method for applying, via immersion into a silane/hydrocarbon solvent solution, a silane composition to form a hydrophobic silane coating that prevents conducive anode filament (CAF) formation in a printed circuit board (PCB) made in accordance with the preferred embodiments of the present invention.

FIG. 3 is a flow diagram illustrating a method 300 for applying, via immersion into a silane/hydrocarbon solvent solution, a silane composition to form a hydrophobic silane coating that prevents conducive anode filament (CAF) formation in a printed circuit board (PCB) made in accordance with the preferred embodiments of the present invention. In the method 300, the steps discussed below (steps 310-350) are performed. These steps are set forth in their preferred order. It must be understood, however, that the various steps may occur at different times relative to one another than shown, or may occur simultaneously. Moreover, those skilled in the art will appreciate that one or more of the steps may be omitted.

Method 300 begins when a substrate that includes glass fiber is cleaned (step 310). The substrate is conventional and may be any suitable substrate that includes glass fiber. For example, the substrate may be woven glass cloth. The substrate is cleaned utilizing any suitable conventional cleaning process, such as the industry standard process for cleaning woven glass fabric described below.

Glass fiber is typically received at the glass weaver on a bobbin and contains a sizing agent typically present at approximately 1.5 wt % of the glass filament. The sizing agent is a starch and oil-based formulation that serves as an anti-static and slip agent which imparts strength to the fabric during the weaving process. The glass filament to be woven in the machine direction may contain 1 wt % PVA to impart additional mechanical strength during the warping process. Following weaving, the fabric is cleaned via an industry standard process:

1) The fabric is wound on a mandrel and subjected to temperatures in excess of 500 C for several hours (a process known to those skilled in the art as "carmelizing" as the fabric takes on a golden brown color).

2) Mandrels are subsequently subjected to temperatures greater than 200 C for several days (in order to permit the temperature in the center of the core to equilibrate with the temperature of the fabric surface).

3) The fabric is permitted to cool to ambient temperature overnight.

The method 300 continues with modification of the surface of the substrate with a silane coupling agent (step 320). The silane coupling agent is conventional and may be any suitable silane coupling agent. For example, the silane coupling agent may be vinylbenzylaminoethylaminopropyltrimethoxysilane or diallylpropylisocyanurate-trimethoxysilane. The silane coupling agent is applied to the surface of the substrate using any suitable conventional surface modification process.

Steps 310 and 320 may be omitted in favor of obtaining a conventional glass fiber substrate having its surface already modified with a silane coupling agent. Such surface modified glass fiber substrates are commercially available from glass weavers. The surface modification processes utilized by these glass weavers may include elements that are considered proprietary to the glass weaver.

Typical process parameters of conventional surface modification processes include the addition of a surfactant to a silane bath (i.e., typically, the glass fabric is dipped in a silane bath) to enhance wetting of the glass fabric as well as prevent foaming. The silane coupling agent concentration in the silane bath may be as high as 1 wt %, for example, though it is typically much less. The silane bath is typically acidic (pH 3-5) to prevent self-condensation of the silane.

In one exemplary conventional surface modification process, the glass fabric may be dipped into 0.1%-0.5% silane coupling agent/water solution (or water-ethanol solution), and then air-dried. The glass fabric may then be placed in a desiccator at 110-120 C for 5-10 minutes to cure the silane coupling agent on the surface of the substrate.

In another conventional surface modification process, an alcohol solution is used for silylating the surface of the substrate with a silane coupling agent. A 2% silane solution can be prepared in a suitable alcohol (e.g., methanol, ethanol, isopropanol, and the like). The surface of the substrate can be wiped, dipped, or sprayed with this solution. If the substrate is dipped into the solution, a sufficient submersion time (e.g., one or two minutes) may be necessary to allow silane migration to the surface of the substrate. The substrate is then dried (e.g., air-dried). After the surface of the substrate dries, excess material can be gently wiped, or briefly rinsed off with alcohol. The layer of silane coupling agent may then be cured on the surface of the substrate for 5-10 minutes at 110 C, or for 24 hours at ambient temperature.

Once the glass fiber has been treated with a silane coupling agent, a large portion of the surface silanols remain. This leaves the surface hydrophilic (water loving) and more likely to increase the chance of CAF formation.

The prior art recognized that a moderate cure cycle (110 C/15 minutes) will leave silanols groups remaining in free form. See, for example, Gerald L. Witucki, "A Silane Primer: Chemistry and Applications of Alkoxy Silanes", Journal of Coating Technology, Vol. 65, No. 822, pages 57-60, July 1993. However, the prior art mistakenly classified these surface silanols as advantageous (rather than as a potentially ruinous path for CAF formation) because the silanols may bond with the subsequent top coat, forming an interpenetrating polymer network (IPN) and providing an improved adhesion.

By treating the surface with a silane composition in accordance with the present invention, the remaining surface silanols will be reacted with and removed. Also, by treating the surface silanols with a silane composition in accordance with the present invention, the surface will become extremely hydrophobic (water repelling). Not only will the use of a silane composition in accordance with the present invention remove surface silanols, but it will also react with and remove any adsorbed water on the surface of the glass fibers preventing another path for CAF formation.

The method 300 then continues by placing the substrate (i.e., the treated glass fabric) in a silane surface modification bath containing a solution of a silane composition in accordance with the present invention and a suitable hydrocarbon solvent (step 330). Step 330 may be performed via means known in the art, such as a dip coating process.

The silane composition in accordance with the present invention includes a silane having a general formula structure $R_1$—Si—$R_{(2-4)}$, wherein $R_1$ is a functional group that is reactive with alcohols, water and/or surface silanols, and wherein $R_2$, $R_3$ and $R_4$ are each a functional group that is hydrophobic and non-reactive (i.e., $R_2$, $R_3$ and $R_4$ are each non-reactive with the alcohols, water and/or surface silanols with which $R_1$ is reactive). Examples of suitable silanes for the silane composition in accordance with the preferred embodiments of the present invention include (without limitation) chlorotrimethylsilane (i.e., $(CH_3)_3SiCl$, also known as trimethylsilylchloride or TMSCl), hexamethyldisilazane (i.e., $[(CH_3)_3Si]_2NH$, also known as HMDS or HMDZ), perfluorooctyl-1H,1H,2H,2H-dimethylchlorosilane (i.e., $C_{10}H_{10}ClF_{13}Si$), and (3,3,3-trifluoropropyl)dimethyl-chlorosilane (i.e., $C_5H_{10}ClF_3Si$); and combinations thereof Examples of suitable hydrocarbon solvents include (without limitation) heptanes, hexanes, pentanes, xylenes, cyclohexane and toluene; and combinations thereof.

The concentration of the silane can range from 0.01 to 100% (vol), preferably 0.05 to 10% (vol) and most preferably 0.1 to 3% (vol). The duration the substrate is exposed to the silane surface modification bath can range, for example, from 0.1 to 1440 minutes, preferably 0.5 to 180 minutes and most preferably 2 to 30 minutes, depending on the final silane surface coverage desired. The hydrophobic silane coating is preferably a mono-layer thick. Those skilled in the art will appreciate, however, that the final silane surface coverage desired will vary depending on the particular application.

Once removed from the bath, the coated substrate (i.e., hydrophobic silane coating/substrate) is dried using any suitable conventional methodology known to those skilled in the art (step 340). For example, the coated substrate may be dried at 110-120 C for 5-10 minutes. Because the surface of the coated substrate is hydrophobic, any residual water thereon is easily and completely removed during step 340.

The coated substrate (i.e., hydrophobic silane coating/substrate) may then be further processed using conventional PCB fabrication techniques (step 350). For example, a conventional varnish (e.g., FR4 epoxy resins, bismaleimide triazine (BT) resins, polyphenylene oxide/trially-isocyanurate (PPO/TAIC) interpenetrating networks, and the like) may be applied to the coated substrate using any suitable conventional methodology known to those skilled in the art. After which the laminate is subjected to curing conditions, e.g., heated under vacuum, as known in the art, which results in a crosslinked phase that is covalently bound to the glass fibers to define a laminate, or laminated PCB. The hydrophobic surface of the coated substrate will prevent water diffusion into the interface between the varnish coating and the glass fiber in the laminated PCB. Even if delamination between the varnish coating and the glass fiber occurs in the PCB, the normally hydrophilic glass fiber is hydrophobic, thus eliminating the most commonly associated path for CAF formation.

One skilled in the art will appreciate that many variations are possible within the scope of the present invention. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. A method of making an enhanced substrate for a printed circuit board, comprising the steps of:
    providing a substrate that includes glass fiber;
    applying a silane coupling agent to the surface of the substrate, wherein the silane coupling agent includes an organofunctional group to bind to a varnish coating and a hydrolyzable group that binds to the surface of the substrate for coupling the substrate to the varnish coating, and wherein the surface of the substrate having the silane coupling agent applied thereto includes one or more surface silanols; and
    applying a silane composition comprising a silane selected from a group consisting of chlorotrimethylsilane, hexamethyldisilazane, perfluorooctyl-1H,1H,2H,2H dimethylchlorosilane, (3,3,3-trifluoropropyl)dimethylchlorosilane, and combinations thereof, to the surface of the substrate having the silane coupling agent applied thereto to form a hydrophobic silane coating a monolayer thick that is an intermixed layer of the silane composition and the silane coupling agent, wherein the silane composition reacts with the one or more surface silanols, and wherein the hydrophobic silane coating presents a surface that is hydrophobic and essentially silanol-free.

2. The method as recited in claim 1, wherein the substrate comprises a sheet of woven glass fibers.

3. The method as recited in claim 1, wherein the step of applying the silane composition includes the steps of:
    drying the surface of the substrate having the silane coupling agent applied thereto;
    after the step of drying the surface of the substrate having the silane coupling agent applied thereto, placing the substrate having the silane coupling agent applied thereto in a vapor phase of the silane composition to form the hydrophobic silane coating by vapor deposition;
    after the step of placing the substrate in a vapor phase of the silane composition, drying the surface presented by the hydrophobic silane coating.

4. The method as recited in claim 1, wherein the step of applying the silane composition includes the steps of:
    placing the substrate having the silane coupling agent applied thereto in a solution of the silane composition and a hydrocarbon solvent;
    after the step of placing the substrate having the silane coupling agent applied thereto in a solution of the silane composition in a hydrocarbon solvent, drying the surface presented by the hydrophobic silane coating.

5. A method of making a printed circuit board (PCB), comprising the steps of:
    providing a substrate that includes glass fiber;
    applying a silane coupling agent to the surface of the substrate, wherein the silane coupling agent includes an organofunctional group to bind to a varnish coating and a hydrolyzable group that binds to the surface of the substrate for coupling the substrate to the varnish coating, and wherein the surface of the substrate having the silane coupling agent applied thereto includes one or more surface silanols;
    applying a silane composition comprising a silane selected from a group consisting of chlorotrimethylsilane, hexamethyldisilazane, perfluorooctyl-1H,1H,2H,2H dimethylchlorosilane, (3,3,3-trifluoropropyl)dimethylchlorosilane, and combinations thereof, to the surface of the substrate having the silane coupling agent applied thereto to form a hydrophobic silane coating a monolayer thick that is an intermixed layer of the silane composition and the silane coupling agent, wherein the silane composition reacts with the one or more surface silanols, and wherein the hydrophobic silane coating presents a surface that is hydrophobic and essentially silanol-free;
    after the step of applying a silane composition, drying the surface presented by the hydrophobic silane coating;
    after the drying step, applying the varnish coating over the surface presented by the hydrophobic silane coating, wherein the silane coupling agent couples the varnish coating to the substrate; and subjecting the substrate, the hydrophobic silane coating and the varnish to curing conditions so as to define a PCB.

6. The method as recited in claim 5, wherein the substrate comprises a sheet of woven glass fibers.

7. The method as recited in claim 5, wherein the step of applying the silane composition includes the steps of:
   drying the surface of the substrate having the silane coupling agent applied thereto;
   after the step of drying the surface of the substrate having the silane coupling agent applied thereto, placing the substrate having the silane coupling agent applied thereto in a vapor phase of the silane composition to form the hydrophobic silane coating by vapor deposition.

8. The method as recited in claim 5, wherein the step of applying the silane composition includes the steps of:
   placing the substrate having the silane coupling agent applied thereto in a solution of the silane composition and a hydrocarbon solvent.

9. The method as recited in claim 1, wherein the step of applying the silane composition includes the steps of:
   drying the surface of the substrate having the silane coupling agent applied thereto;
   after the step of drying the surface of the substrate having the silane coupling agent applied thereto, placing the substrate having the silane coupling agent applied thereto in a vapor phase of the silane composition to form the hydrophobic silane coating by vapor deposition, wherein the vapor deposition is performed at a vapor pressure of 2-7 mm Hg for 2-30 minutes while the substrate having the silane coupling agent applied thereto is maintained at 45-90° C.;
   after the step of placing the substrate in a vapor phase of the silane composition, drying the surface presented by the hydrophobic silane coating.

10. The method as recited in claim 5, wherein the step of applying the silane composition includes the steps of:
   drying the surface of the substrate having the silane coupling agent applied thereto;
   after the step of drying the surface of the substrate having the silane coupling agent applied thereto, placing the substrate having the silane coupling agent applied thereto in a vapor phase of the silane composition to form the hydrophobic silane coating by vapor deposition, wherein the vapor deposition is performed at a vapor pressure of 2-7 mm Hg for 2-30 minutes while the substrate having the silane coupling agent applied thereto is maintained at 45-90° C.

* * * * *